United States Patent
Balchandani et al.

(10) Patent No.: US 7,683,618 B2
(45) Date of Patent: Mar. 23, 2010

(54) SLICE-SELECTIVE TUNABLE-FLIP ADIABATIC LOW PEAK POWER EXCITATION

(75) Inventors: Priti Balchandani, Menlo Park, CA (US); Daniel Spielman, Menlo Park, CA (US); John Pauly, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/048,107

(22) Filed: Mar. 13, 2008

(65) Prior Publication Data

US 2009/0230958 A1 Sep. 17, 2009

Related U.S. Application Data

(60) Provisional application No. 61/066,158, filed on Nov. 26, 2007.

(51) Int. Cl.
*G01V 3/00* (2006.01)
(52) U.S. Cl. ...................................... 324/309; 324/307
(58) Field of Classification Search ......... 324/300–322; 600/410–435
See application file for complete search history.

(56) References Cited

U.S. PATENT DOCUMENTS

| 5,019,784 | A | | 5/1991 | Garwood et al. |
| 5,914,599 | A | * | 6/1999 | Sharp ........................ 324/318 |
| 6,064,203 | A | * | 5/2000 | Bottomley .................. 324/309 |
| 6,166,541 | A | * | 12/2000 | Smith et al. ................. 324/300 |
| 6,809,518 | B2 | * | 10/2004 | Beaudoin et al. ............ 324/314 |
| 7,446,526 | B2 | * | 11/2008 | Cunningham et al. ....... 324/307 |

OTHER PUBLICATIONS

Balchandani et al., "Slice-Selective Tunable-Flip Adiabatic Low Peak-Power Excitation Pulse," Magnetic Resonance in Medicine, vol. 59 issue 5, pp. 1072-1078, 2008.

* cited by examiner

*Primary Examiner*—Brij B Shrivastav
*Assistant Examiner*—Dixomara Vargas
(74) *Attorney, Agent, or Firm*—Beyer Law Group LLP

(57) ABSTRACT

A manifestation of the invention provides a method for slice selective excitation for magnetic resonance imaging (MRI). A $B_0$ field is applied. A STABLE pulse comprising of a BIR-4 envelope sampled by a plurality of subpulses with a duration is applied, where amplitude and frequency modulation functions of the BIR-4 envelope are slowly varying with respect to the duration of the subpulses. A portion of k-space is read out to obtain k-space data. The STABLE pulse and readout are repeated until sufficient k-space has been acquired. A Fourier Transform of the k-space data is taken.

18 Claims, 10 Drawing Sheets

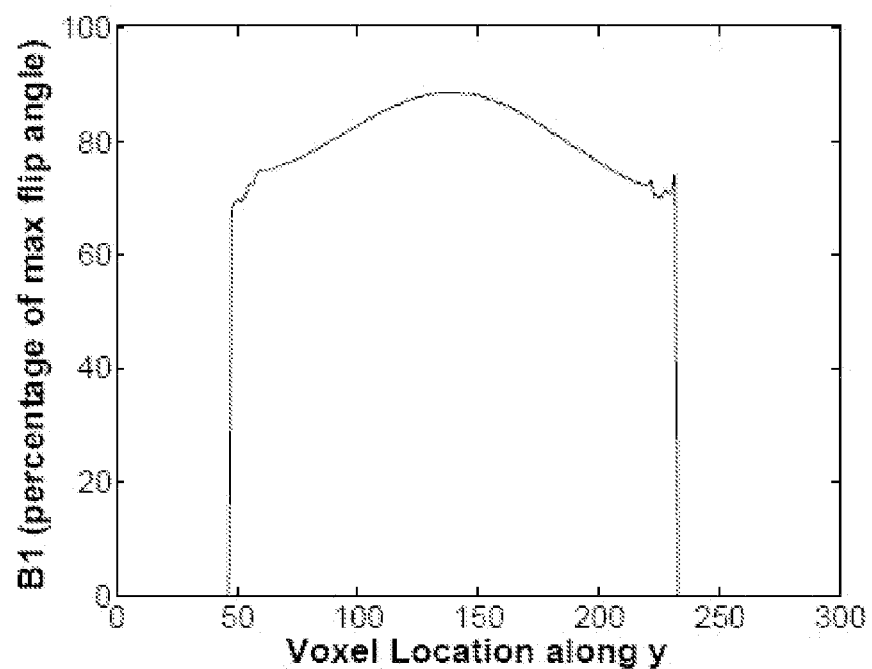
FIG. 6
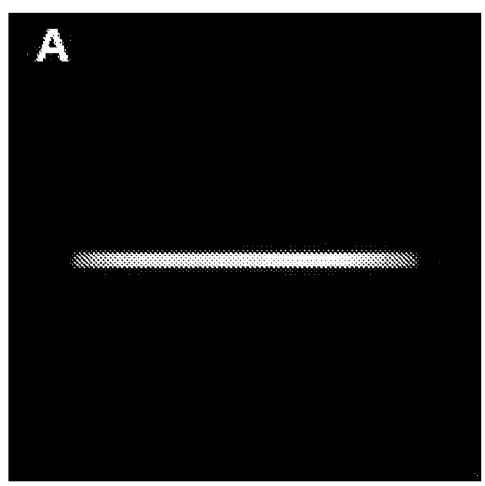 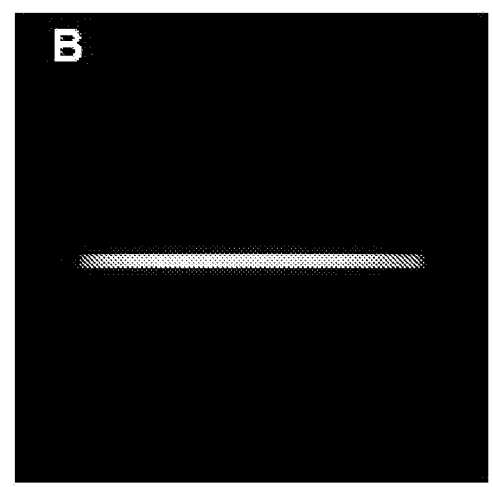
FIG. 7A          FIG. 7B

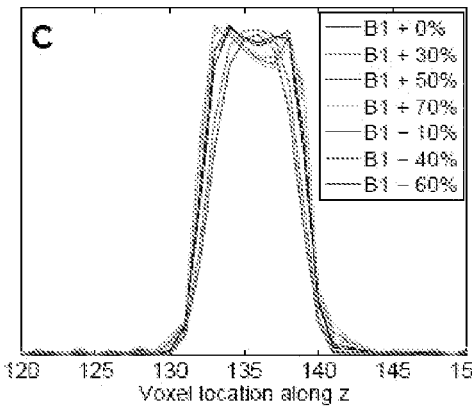
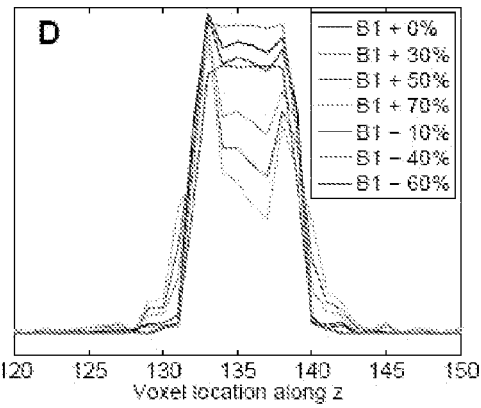
FIG. 7C        FIG. 7D
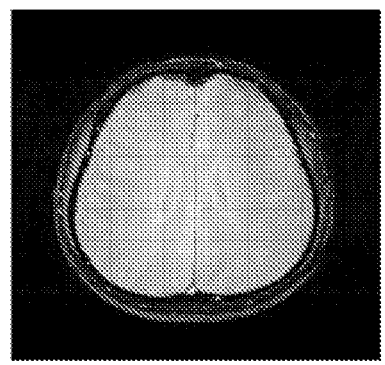
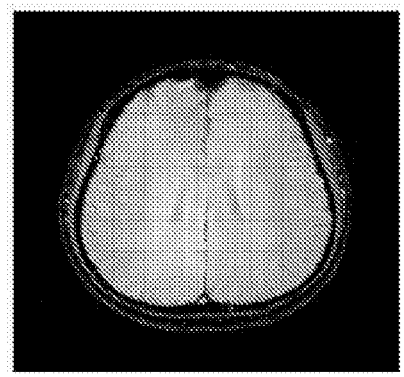
FIG. 8 A       FIG. 8 B
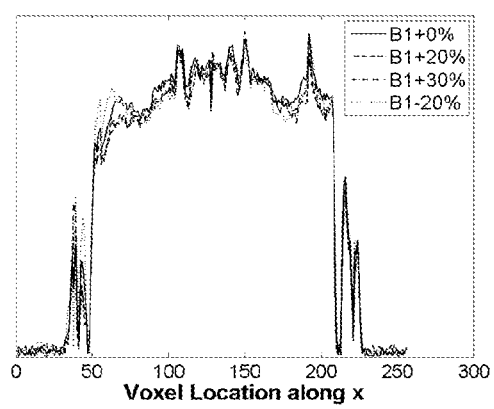
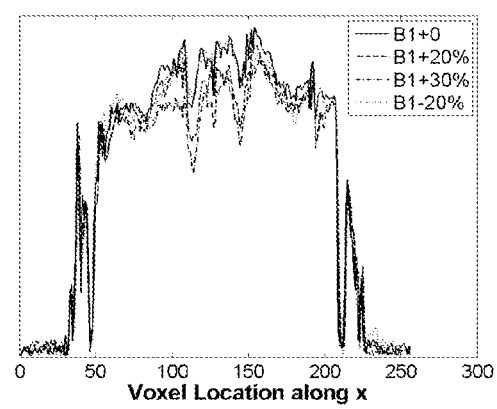
FIG. 8 C       FIG. 8D

SLICE-SELECTIVE TUNABLE-FLIP ADIABATIC LOW PEAK POWER EXCITATION

CROSS REFERENCE TO RELATED APPLICATIONS

This application claims priority under 35 U.S.C. §119(e) from co-pending U.S. Provisional Application No. 61/066,158, entitled "SLICE-SELECTIVE TUNABLE-FLIP ADIABATIC LOW PEAK POWER EXCITATION", filed Nov. 26, 2007, and naming Balchandani et al. as inventors, which is incorporated by reference in its entirety for all purposes.

STATEMENT REGARDING FEDERALLY SPONSORED RESEARCH OR DEVELOPMENT

The U.S. Government has rights in the disclosed invention pursuant to NIH Grant No. RR09784 to Stanford University.

BACKGROUND OF THE INVENTION

This invention relates generally to magnetic resonance imaging (MRI)

Magnetic resonance imaging (MRI) requires placing an object to be imaged in a static magnetic field ($B_0$), exciting nuclear spins in the object with a RF magnetic field ($B_1$), and then detecting signals emitted by the excited spins as they precess within the magnetic field ($B_0$). Through the use of magnetic gradient and phase encoding of the excited magnetization, detected signals can be spatially localized in three dimensions.

SUMMARY

A manifestation of the invention provides a method for slice selective excitation for magnetic resonance imaging (MRI). A $B_0$ field is applied. A STABLE pulse comprising of a BIR-4 envelope sampled by a plurality of subpulses with a duration is applied, where amplitude and frequency modulation functions of the BIR-4 envelope are slowly varying with respect to the duration of the subpulses. A portion of k-space is read out to obtain k-space data. The STABLE pulse and readout are repeated until sufficient k-space has been acquired. A Fourier Transform of the k-space data is taken.

In another manifestation of the invention, a computer implemented method for slice selective excitation for magnetic resonance imaging (MRI) is provided. A $B_0$ field is applied. A STABLE pulse comprising of a BIR-4 envelope sampled by several subpulses with a duration is applied, where amplitude and frequency modulation functions of the BIR-4 envelope have a bandwidth where 1/(subpulse duration)>2*(the bandwidth of the amplitude and frequency modulation functions). A portion of k-space is read out to obtain k-space data. The STABLE pulse and readout are repeated until the sufficient k-space has been acquired. A Fourier Transform is taken of the k-space data. An image is generated from the Fourier Transform of the k-space data. The image is displayed on a display.

In another manifestation of the invention a magnetic resonance imaging apparatus is provided. A magnetic resonance imaging excitation and detection system is provided. A controller is electrically connected to the magnetic resonance imaging excitation and detection system and comprises a display, at least one processor, and computer readable media. The computer readable media comprises computer readable code for applying a $B_0$ field, computer readable code for applying a STABLE pulse comprising of a BIR-4 envelope sampled by several subpulses with a duration, where amplitude and frequency modulation functions of the BIR-4 envelope have a bandwidth where 1/(subpulse duration)>2*(the bandwidth of the amplitude and frequency modulation functions), computer readable code for reading out a portion of k-space to obtain k-space data, computer readable code for repeating the applying a STABLE pulse and reading out a portion of k-space until sufficient k-space has been acquired, computer readable code for taking a Fourier Transform of the k-space data, computer readable code for generating an image from the Fourier Transform of the k-space data, and computer readable code for displaying the image on the display.

The invention and objects and features thereof will be more readily apparent from the following detailed description and appended claims when taken with the drawings.

BRIEF DESCRIPTION OF THE DRAWINGS

FIG. 6 shows a horizontal cross section of a receive $B_1$ profile for a spherical agar phantom for a head coil.

FIGS. 7A-B are through-plane images, showing a selected slice, of a spherical agar phantom acquired using the STABLE pulse and a Hamming-windowed sinc pulse in a GRE sequence FIG. 7C plots of the central vertical cross sections of images, showing a slice profile achieved by spatial subpulses of a STABLE pulse.

FIG. 7D plots of the central vertical cross sections of images, showing a slice profile achieved by spatial subpulses of a sinc pulse.

FIGS. 8A-D are images and cross-sectional plots of in vivo data from the brain of a normal volunteer scanned at 3T.

DETAILED DESCRIPTION OF ILLUSTRATIVE EMBODIMENTS

Figure 1A:
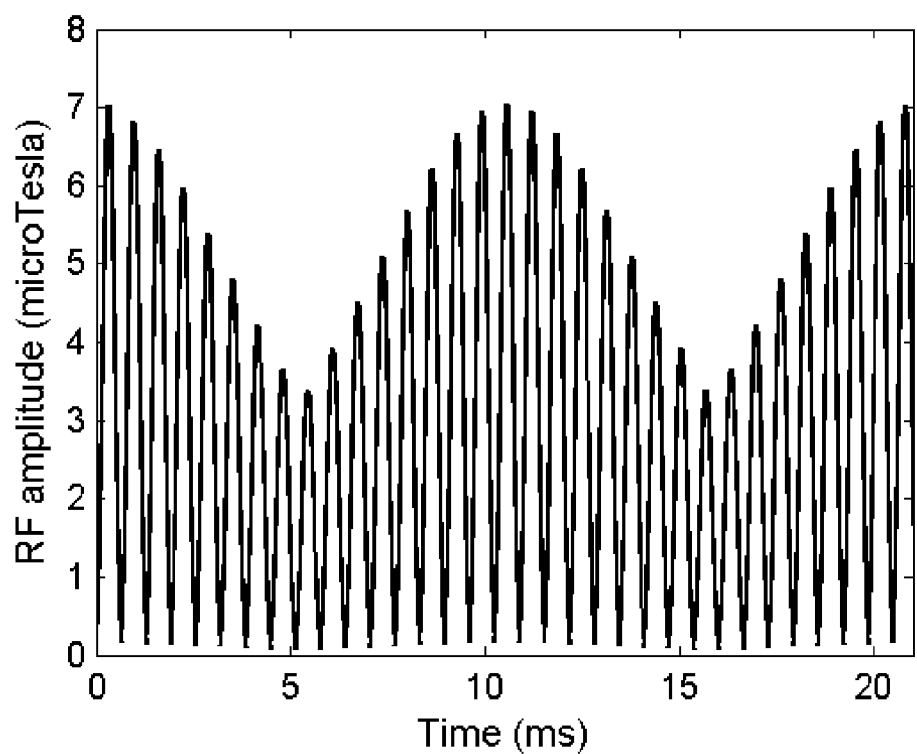
FIGS. 1A-B show the magnitude and phase of a final 21 ms STABLE 90° RF pulse.

In the specification and claims the phrase "adiabatic pulse" is defined as a pulse that is $B_1$ insensitive above a certain threshold.

MRI at high magnetic fields offers the advantage of increased SNR but suffers from signal losses due to increased $B_1$ inhomogeneity. Adiabatic pulses, particularly 180° slice selective inversion and refocusing pulses, may be used instead of standard windowed sinc pulses to provide some immunity to $B_1$ variations. $B_1$ Independent Rotation-4 (BIR-4) pulses, which are described in U.S. Pat. No. 5,019,784 to Michael Garwood et al. and which is incorporated by reference, have been shown to achieve adiabatic excitation with user-selectable flip angles. However, these pulses are neither spatially nor spectrally selective. U.S. Pat. No. 5,019,784 describes a BIR-4 pulse as a $B_1$ Independent Rotation-4 pulse, which incorporates two $B^e$ inversions along the z'-axis (i.e., the sign of the frequency sweep $\Delta\omega(t)$, is reversed twice during the pulse). The rotation angle induced by this pulse is equal to the difference between the signs of two discontinuous phase shifts, $\phi_1$ and $\phi_2$, each of which takes place concomitantly with a $B^e$ inversion. The reference further states that optimal efficiency is achieved with BIR-4 when $\phi_1=180°+\Theta/2$ and $\phi_2=-180°-\Theta/2$, where $\Theta$ is the desired flip angle.

The BIR-4 pulse design has been extended through the use of gradient modulation techniques to create slice-selective adiabatic excitation pulses. Examples include GMAX, BISS-8 and SLAB-4. Unfortunately, these techniques require high RF amplitude, typically above the maximum output of the RF amplifiers available on most available commercial human scanners. They also require a high gradient strength and slew rate. This limits their utility to applications such as MR microscopy, animal experiments, and human studies using small surface transmit RF coils. An embodiment of the invention has developed an alternative gradient modulated approach that achieves adiabatic slice-selection with significantly lower RF peak power requirements. This Slice-selective Tunable-flip AdiaBatic Low peak-power Excitation (STABLE) pulse consists of an oscillating gradient in conjunction with a slowly varying BIR-4 RF envelope that is sampled by many spatial subpulses, where each subpulse has a duration, in order to achieve spatial selectivity. In this embodiment, a slowly varying BIR-4 RF envelope is defined as an envelope where 1/(subpulse duration)>2*(the bandwidth of the amplitude and frequency modulation functions). These adiabatic pulses can be designed to achieve an arbitrary flip angle. The theory and design of the pulses is similar to that of conventional, non-adiabatic, spatial-spectral pulses. However, STABLE pulses are only spatially selective. The peak RF power needed to achieve adiabaticity for these pulses is well within the capabilities of a system's RF amplifier, which is 17 µT. In addition to adiabaticity, greater immunity to chemical shift localization error results due to the high spatial bandwidth of the short subpulses used for spatial selectivity.

Methods

Pulse Design

First, an adiabatic excitation pulse with a BIR-4 pulse envelope was designed using an embodiment of the invention. As in the conventional BIR-4 design, the pulse was made up of four adiabatic half-passage segments, with the first and the third segment being time-reversed. This embodiment uses a BIR-4 design with a sech/tanh amplitude/frequency modulation function instead of the conventional tanh/tan modulation function so that the amplitude variations were sufficiently slow to be accurately sampled by a reasonable number of subpulses. The equations for the amplitude and frequency modulation functions for the pulse are:

$$A(t) = \begin{cases} A_0 \text{sech}(\beta t) & 0 \leq t < T/4 \\ A_0 \text{sech}(\beta(t-T/2)) & T/4 \leq t < 3T/4 \\ A_0 \text{sech}(\beta(t-T)) & 3T/4 \leq t \leq T \end{cases} \quad (1)$$

$$\Delta\omega(t) = \begin{cases} -\mu\beta\tanh(\beta t) & 0 \leq t < T/4 \\ -\mu\beta\tanh(\beta(t-T/2)) & T/4 \leq t < 3T/4 \\ -\mu\beta\tanh(\beta(t-T)) & 3T/4 \leq t \leq T \end{cases} \quad (2)$$

where A(t) is the amplitude modulation function, $\Delta\omega(t)$ is the frequency modulation function, $A_0$ is the maximum $B_1$ field, $\beta$ is the modulation angular frequency, $\mu$ is a dimensionless parameter that determines the spectral bandwidth, and T is the pulse duration.

A $\beta$ value of 280 rad/s and $\mu$ of 3.4 were chosen to minimize pulse duration, and therefore echo time, and achieve good off-resonance behavior while maintaining adiabaticity. A phase discontinuity was introduced between the first and second segments and between the third and fourth segments to produce the desired flip angle, which is 90° for this particular design. The final adiabatic spectral excitation pulse was 21 ms long and had a spectral bandwidth, or off-resonance immunity, of approximately 80 Hz. The spectral pulse was then subsampled with the number of sublobes chosen as a trade-off between adiabaticity and minimum slice thickness. Given a fixed pulse duration, if the pulse is sampled too finely, the subpulse duration is too short to cover the gradient area required for thinner slices. If the pulse is sampled too coarsely, the spectral profile for the BIR-4 spectral envelope degrades. Course sampling also results in spatial subpulses with larger flip angles that are more easily overdriven, yielding a spatial profile that is less $B_1$-immune. Preferably, there are at least five spatial subpulses per pulse. More preferably, there are 10 to 50 subpulses per pulse. Most preferably, there are 20 to 40 subpulses per pulse.

Figure 1B:
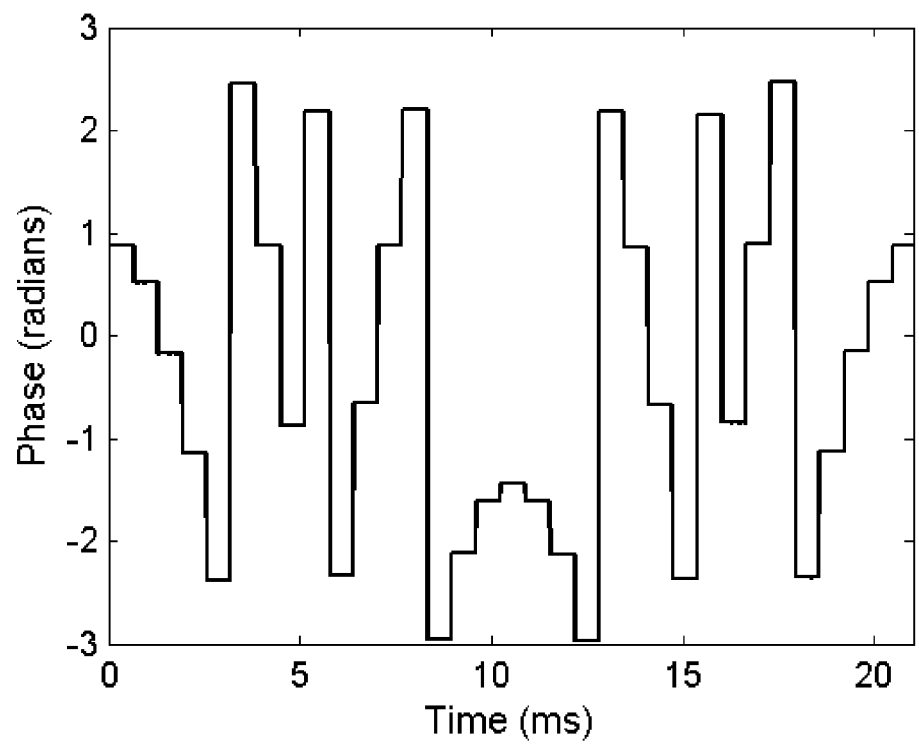
Figure 1C:
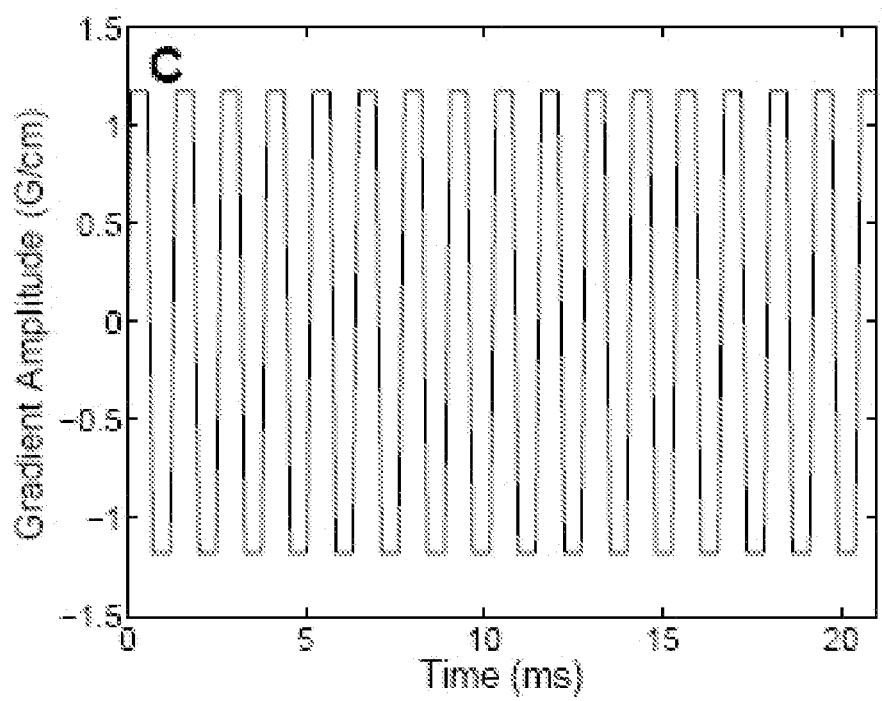
FIG. 1C shows a gradient waveform in with which a pulse is played in conjunction.
Figure 2:
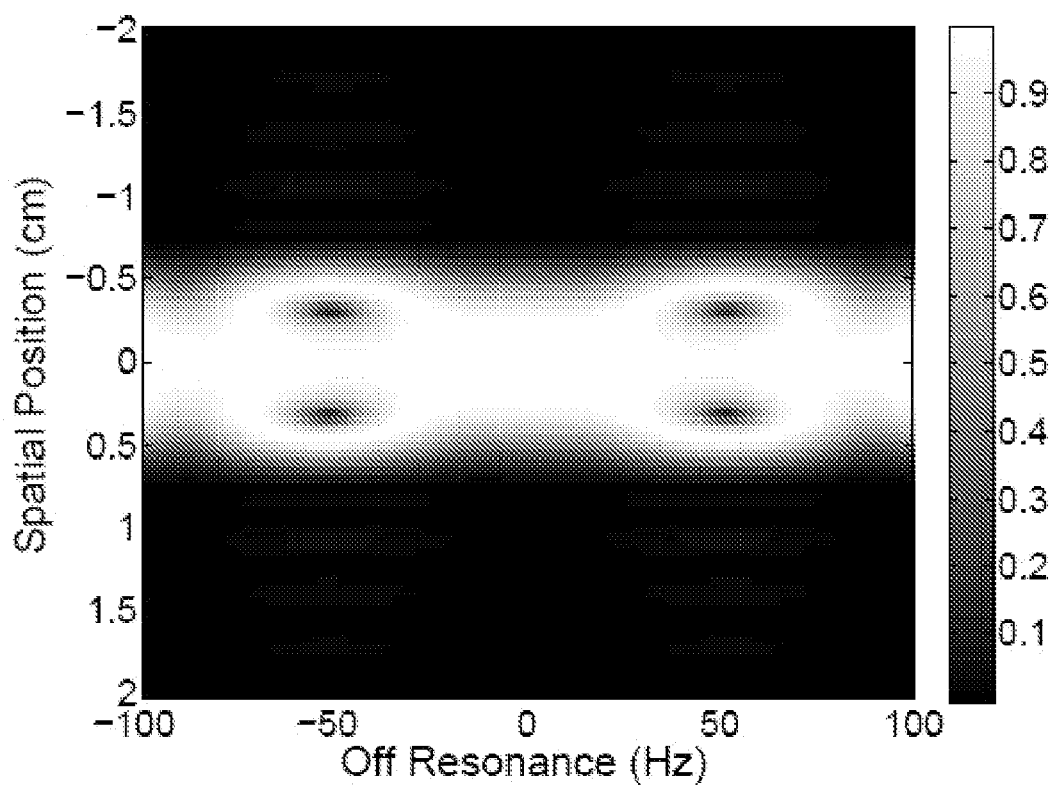
FIG. 2 is a simulated 2D spatial-spectral excitation profile for the pulse, showing the slice profile at a range of off-resonant frequencies.

The final STABLE pulse was comprised of 33, 0.64 ms-long, conventional small tip-angle subpulses scaled by the sampled values of the adiabatic envelope given in Eqns. 1 and 2. The resulting spatial bandwidth was 4300 Hz. FIGS. 1A-B show the magnitude and phase of the final 21 ms STABLE 90° RF pulse. The pulse is played in conjunction with the oscillating gradient waveform shown in FIG. 1C. The peak $B_1$ value of the pulse is well below the 17 µT limit of a 3 T RF amplifier. FIG. 2 is a simulated 2D spatial-spectral excitation profile for the pulse, showing the slice profile at a range of off-resonant frequencies. The slice profile remains constant for a ±40 Hz shift in resonant frequency. Immunity to off-resonance may be traded off for overdrive factor.

Figure 3A:
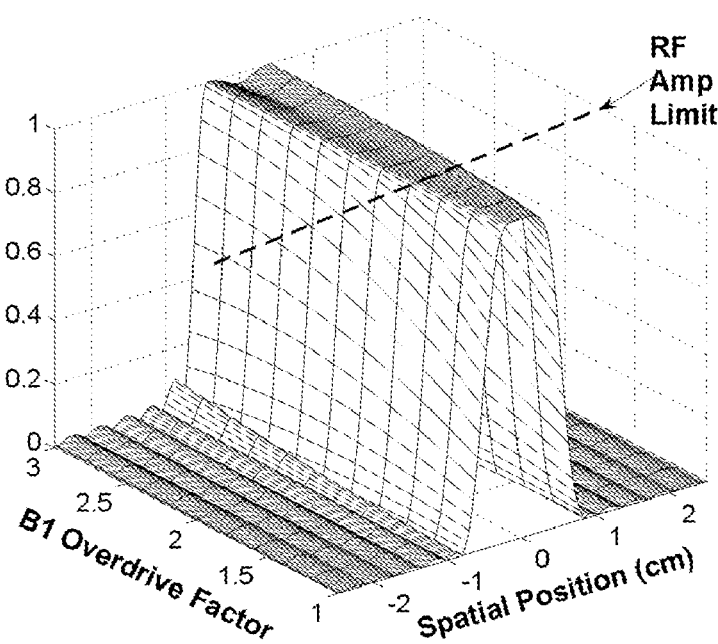
FIG. 3A shows a simulated spatial profile for a range of $B_1$ overdrive factors above adiabatic threshold.
Figure 3B:
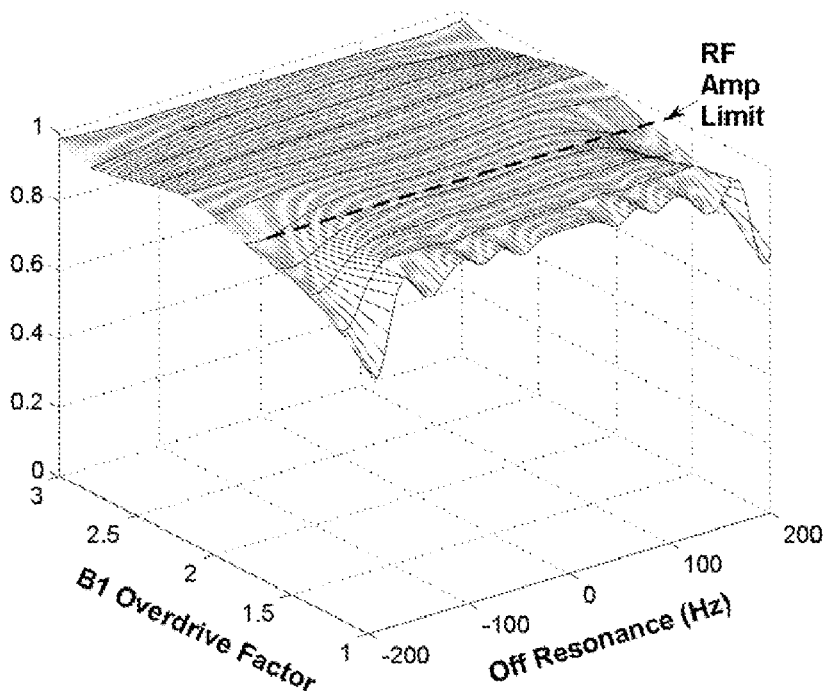
FIG. 3B shows a spectral profile of the pulse over the same range of $B_1$ overdrive factors.

The adiabaticity of spatial and spectral excitation profiles of the pulse were first verified through simulations. In FIG. 3A, the simulated spatial profile is shown for a range of $B_1$ overdrive factors above adiabatic threshold. If the nominal $B_1$ is set to be at the adiabatic threshold, the pulse may be overdriven by 67% (overdrive factor of 1.67) before reaching RF peak amplitude limit of 17 µT for our 3T RF amplifier. An increase in stop band ripple as well as some signal loss at the center of the spatial passband at higher overdrive factors is noticeable in FIG. 3A. However, the spatial profile is still fairly stable for the $B_1$ range at which we plan to operate, which is at overdrive factors below 1.67. FIG. 3B shows the spectral profile of the pulse over the same range of $B_1$ overdrive factors. Close to 100% excitation is achieved for resonances within an 80 Hz spectral bandwidth, even at very high $B_1$ overdrive factors.

Final Pulse Sequence

Figure 4:
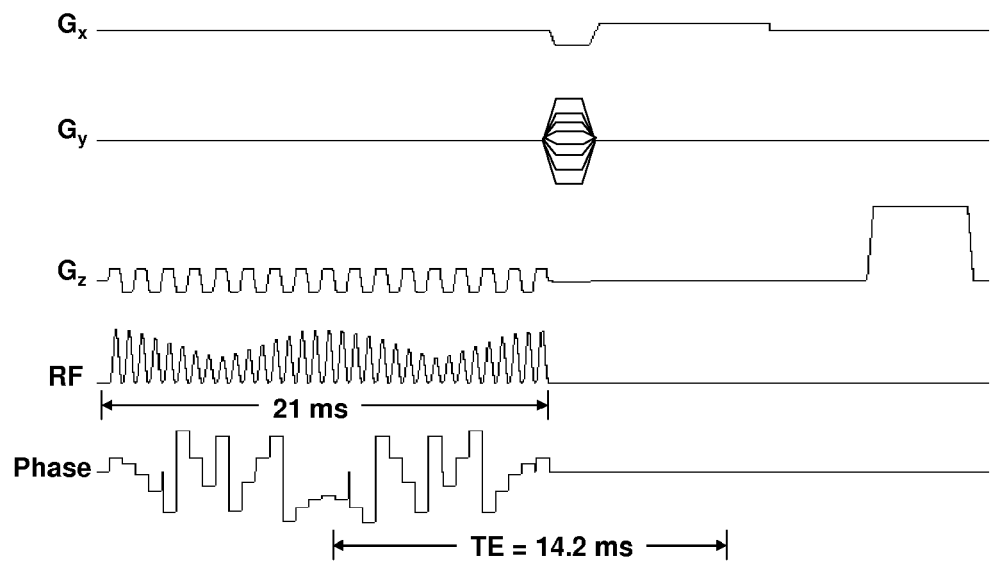
FIG. 4 shows RF amplitude, phase and gradient waveforms for a GRE sequence which uses a STABLE pulse for excitation.

The STABLE pulse was integrated into a Gradient Recalled Echo (GRE) sequence to compare it to a standard GRE sequence with a conventional Hamming-windowed sinc (hereinafter referred to as sinc) excitation pulse. FIG. 4 shows the RF amplitude, phase and gradient waveforms for a GRE sequence which uses the STABLE pulse for excitation. With the 21 ms STABLE pulse, a 1.7 ms phase encode and 4 ms readout duration, a minimum echo time (TE) of 14.2 ms can be achieved. Due to the spin-locked state of the magnetization for the duration of the STABLE pulse, instead of pure $T_2$ decay, the signal decay occurs by a combination of longitudinal and transverse relaxation in the rotating frame. A magnetization vector that is rotating perpendicular to the effective field of an adiabatic pulse, undergoes $T_{2\rho}$ relaxation. During a BIR-4 pulse, the magnetization vector remains mainly perpendicular to the effective field; therefore, relaxation during the STABLE pulse will be mainly due to $T_{2\rho}$. Also, $T_2^*$ decay begins at the end of the pulse instead of the midpoint. Hence, the TE value is not exactly analogous to the TE for a conventional GRE sequence, during which both pure $T_2$ decay and $T_2^*$ decay occur. As a result, The effective TE for the sequence in FIG. 4 is actually much shorter than 14.2 ms due to the slower effective decay.

Phantom and In Vivo Experiments

Data was obtained from a spherical agar phantom scanned with a standard birdcage head coil at 3 T (Echospeed whole-body magnet; GE Healthcare, Waukesha, Wis., USA). A 5 mm slice was excited with the STABLE pulse using the sequence in FIG. 4 and compared to a conventional sinc pulse in a GRE sequence. Acquisition parameters were: TE/TR=14.2/500 ms and matrix size=256×256. Several such images were obtained with the STABLE pulse scaled to a range of $B_1$ values. The experiment was repeated for the conventional sinc pulse. $B_1$ scaling was performed by varying the pulse amplitude to a percentage of the nominal $B_1$ value, in increments of 10%. The nominal $B_1$ value was the value set during prescan at which the maximum signal was received from the entire excited slice. Variation in the image cross section was compared.

In order to test slice selectivity, several through-plane images of the spherical phantom were obtained by changing the readout gradient to the slice-select dimension. Acquisition parameters remained the same (i.e. slice thickness=5 mm, TE/TR=14.2/500 ms and matrix size=256×256). Cross sections of images obtained using the STABLE GRE sequence as well as a conventional GRE sequence were obtained for a range of $B_1$ values, so that slice profile degradation as $B_1$ was overdriven could be compared.

In vivo data was obtained from the brain of a normal volunteer scanned at 3 T (Echospeed whole-body magnet; GE Healthcare, Waukesha, Wis., USA) with a standard birdcage head coil. As in the case of the phantom experiments, several images were obtained using the STABLE pulse as well as a conventional sinc scaled to a range of $B_1$ values and image cross sections were compared. Acquisition parameters were: slice thickness=5 mm, TE/TR=14.2/1000 ms and matrix size 256×256.

Results

Phantom Results

Figure 5A:
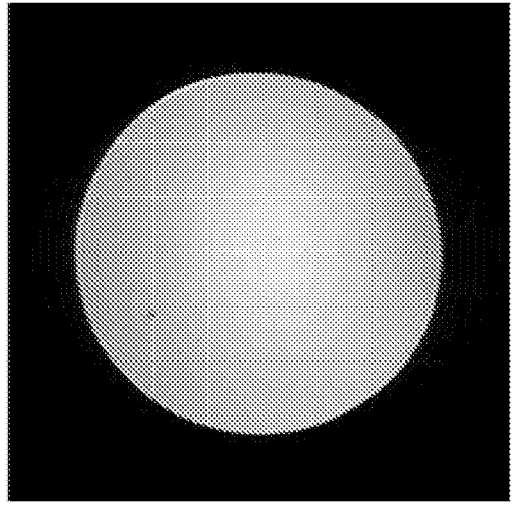
FIGS. 5A-B show in-plane images from a spherical agar phantom scanned at 3 T obtained using the STABLE pulse and a Hamming-windowed sinc pulse.
Figure 5B:
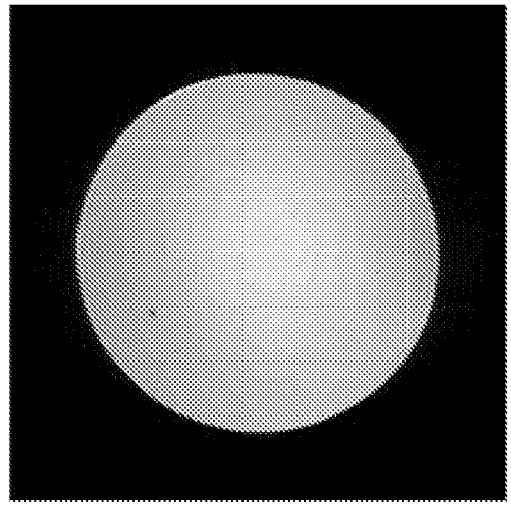
Figure 5C:
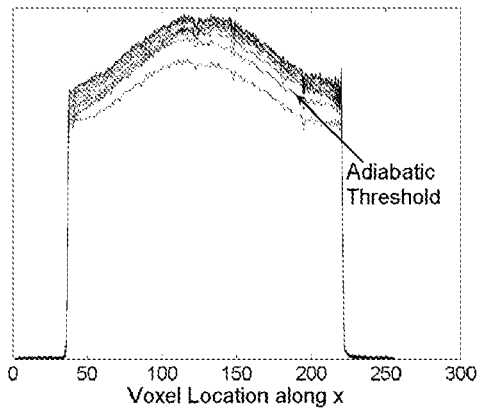
FIG. 5C shows plots of a few chosen central horizontal cross sections through a phantom using an embodiment of the invention.
Figure 5D:
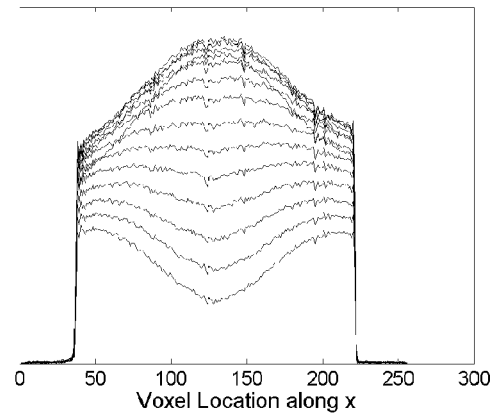
FIG. 5D shows plots of a few chosen central horizontal cross sections through a phantom using a conventional sinc pulse.
Figure 5E:
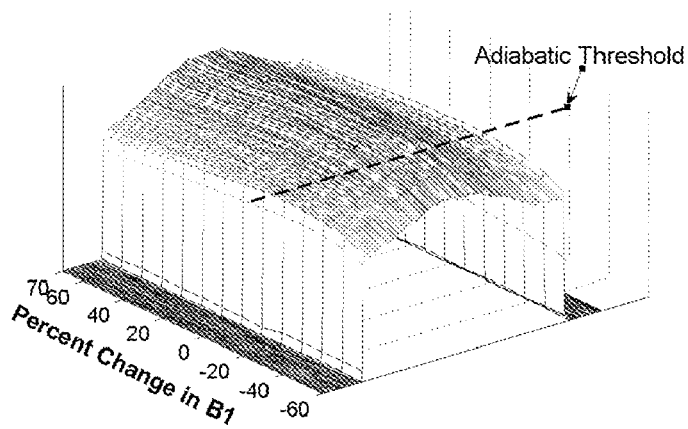
FIGS. 5E-F show mesh plots in for the STABLE and sinc pulse respectively.
Figure 5F:
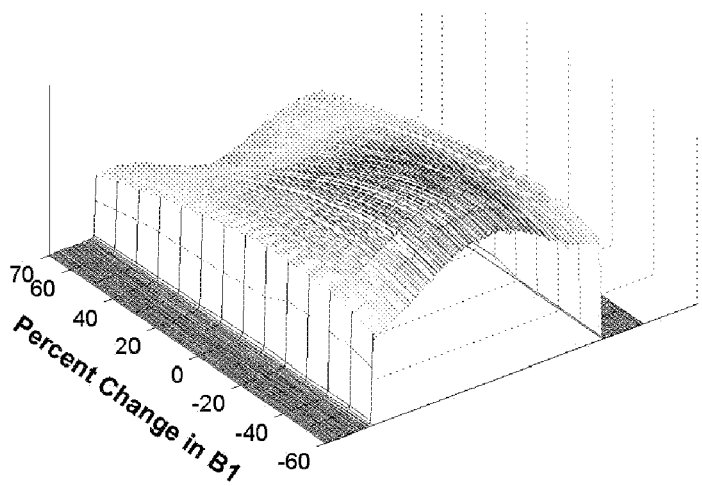

FIGS. 5A-B show in-plane images from a spherical agar phantom scanned at 3 T obtained using the STABLE pulse (FIG. 5A) and a Hamming-windowed sinc pulse (FIG. 5B). A GRE sequence was used to excite and image a 5 mm slice. Several such images were obtained with the STABLE pulse scaled from +70% to −60% of the nominal RF pulse amplitude. Acquisition parameters were: TE/TR=14.2/500 ms and matrix size 256×256. FIG. 5C shows the plots of a few chosen central horizontal cross sections through the phantom. The adiabatic threshold is reached at around 40% below nominal peak $B_1$. Above the adiabatic threshold, the excited cross section remains largely invariant. The same experiment conducted using a standard GRE sequence with a conventional sinc pulse yielded the result in FIG. 5D, demonstrating that scaling the RF causes significant variation in the image cross-sections. All obtained cross sections are plotted against $B_1$ value and shown in the form of mesh plots in FIGS. 5E and F for the STABLE and sinc pulse respectively. The cross-section obtained with a sinc, excitation pulse varies significantly as $B_1$ is scaled, while the cross-sections obtained with the STABLE pulse stays largely invariant after an adiabatic threshold is reached.

The cross sections in FIG. 5C are not flat due to image shading caused by the receive $B_1$ profile. FIG. 6 shows a horizontal cross section of the receive $B_1$ profile for the spherical agar phantom for the head coil used in the above experiment. Images obtained from both STABLE and sinc pulses are attenuated by this profile. Because adiabatic pulses can only reduce transmit $B_1$ inhomogeneity, image shading due to the receiver $B_1$ profile is still present. Although images obtained using the STABLE pulse benefit from a uniform transmit profile, they are still susceptible to shading due to the $B_1$ receive profile. Consequently, the horizontal cross-section of images obtained using the STABLE pulse follow the shape of the $B_1$ receive profile.

FIGS. 7A-B are through-plane images, showing the selected slice, of the spherical agar phantom acquired using the STABLE pulse (FIG. 7A) and a Hamming-windowed sinc pulse in a GRE sequence (FIG. 7B) using a birdcage head coil at 3 T. Acquisition parameters were: TE/TR=14.2/500 ms, slice thickness=5 mm, and matrix size=256×256. As in the in-plane case, several images were obtained with the STABLE pulse scaled from +70% to −60% of the nominal RF pulse magnitude. FIG. 7C plots of the central vertical cross sections of these images, showing the slice profile achieved by the spatial subpulses of the STABLE pulse. Some degradation of the slice profile occurs at larger $B_1$ values due to higher flip-angle subpulses becoming slightly overdriven. However, the effect is much less than that seen in FIG. 7D for slice profiles of a sinc pulse that is identically scaled.

In Vivo Results

In vivo data from the brain of a normal volunteer scanned at 3T, using a birdcage head coil, is used to provide the images and graphs of FIGS. 8A-D. FIG. 8A shows an image obtained using the STABLE pulse in a GRE sequence to excite and image a 5 mm slice. Several such images were obtained with the STABLE pulse scaled from −20% to +30% of the nominal RF pulse magnitude. FIG. 8C shows the plots of the central horizontal cross sections of these images, demonstrating minimal variation of the cross-sectional profile as $B_1$ is varied. Of the variation that does occur, some portion may be attributed to patient motion between scans. The same experiment was conducted using a standard GRE sequence utilizing a sinc pulse with the same sequence parameters. FIG. 8B shows the image obtained with a standard GRE sequence with a conventional Hamming-windowed sinc excitation pulse. FIG. 8 D shows the horizontal cross-sections when $B_1$ is varied. Variations with $B_1$ scaling are evident in the images generated using the sinc pulse. The acquisition parameters were: TE/TR=14.2/1000 ms, slice thickness=5 mm, and matrix size=256×256.

Discussion

Phantom and in vivo data demonstrate that the STABLE pulse is slice-selective as well as adiabatic over at least a 50% change in $B_1$ while remaining within the RF peak amplitude limit of 17 µT for our 3 T scanner. $B_1$ variation across the adult human head has been reported as 23% at 4 T and 42% at 7 T. Thus, given the range of $B_1$ immunity offered, the STABLE pulse may also be useful at these fields. The pulse used to obtain the phantom and in vivo data in FIGS. 5, 7 and 8 was designed to achieve a 90° flip angle, however, STABLE pulses may be designed to achieve arbitrary flip angles simply by adjusting the phase discontinuity introduced between the pulse segments.

When comparing FIGS. 8A and B, contrast in some regions of the brain is noticeably different. Contrast between gray and white matter seems to be slightly enhanced for the STABLE pulse versus the sinc, especially at the periphery of the brain. Several different factors may be contributing to the unique contrast achieved by the STABLE pulse. First, the magnetization vector is mainly spin-locked perpendicular to the effective field for the duration of the STABLE pulse. The magnetization vector in this state undergoes $T_{2\rho}$ relaxation. $T_{2\rho}$ contrast has been observed in the brain and was found to be dominated by dynamic averaging (e.g., exchange and diffusion between different magnetic sites), with only a small contribution from dipole-dipole interactions. $T_{2\rho}$ has been found to be generally 50% greater than $T_2$ throughout the brain, resulting in overall improved $T_2$-like contrast in $T_2$-weighted images. The slightly enhanced gray-white contrast in the in vivo images acquired using the STABLE pulse, may be the result of this effect. Second, since readout occurs close to the end of the STABLE pulse in our sequence, as shown in FIG. 4, reduced $T_2^*$ decay may also affect the contrast. In FIG. 8A, $T_2^*$ decay begins at the midpoint of the sinc pulse and continues for the duration of TE (14.2 ms) until readout. In contrast, in FIG. 8B, $T_2^*$ decay begins at the end of the STABLE pulse. The spin-locked state of the magnetization for the duration of the pulse results in the suppression of $T_2^*$ decay. Thus, in this case, $T_2^*$ decay continues for only 3.2 ms. Third, substances that experience motion, such as cerebrospinal fluid (CSF), may behave differently if they are spin-locked for a large portion of TE, as is the case for the sequence in FIG. 4. This may explain the slightly brighter CSF signal in FIG. 8A when compared to FIG. 8B. Lastly, some of the enhanced signal observed at the periphery of the brain may be due to the flatter transmit $B_1$ profile of the STABLE pulse resulting in less apodization of the image.

The 21 ms STABLE pulse provided by this embodiment of the invention is robust to a ±40 Hz center frequency shift due to $B_0$ inhomogeneity. When comparing FIGS. 8A and B, no additional artifacts due to $B_0$ shifts are apparent for the image acquired with the STABLE pulse, indicating sufficient off-resonance immunity at 3 T. However at higher fields such as 7 T, a STABLE pulse with a greater spectral bandwidth may be required to remain immune to $B_0$ inhomogeneity, which scales with field. This can be achieved by increasing the µ or β values in Eqns. 1 and 2. However, for the same RF peak amplitude, this will require an increased pulse length in order to prevent discontinuities at the margins of the RF envelope due to truncation. As the total pulse length increases, it is possible to use more subpulses, where the subpulse duration is unchanged, resulting in a more accurate estimate of the spectral envelope and consequently smoother off-resonance profile. Longer pulses result in longer echo times, however, since the transverse relaxation of the magnetization during the pulse is due mainly to $T_{2\rho}$, which is larger than $T_2$, slower decay of magnetization can be expected, easing the requirement for a short pulse duration.

In addition to standard imaging sequences, the STABLE pulse may be integrated into proton Magnetic Resonance Spectroscopic Imaging ($^1$H MRSI) sequences. $^1$H MRSI greatly benefits from the increased SNR and spectral resolution offered at high fields, but suffers from the proportionate increase in $B_1$ inhomogeneity and chemical shift localization error. Chemical shift localization error refers to the relative shift in space of the excited volumes for different metabolites due to their different resonant frequencies. In addition to insensitivity to $B_1$ variation, STABLE pulses are less susceptible to chemical shift localization error due to the high spatial bandwidth of the short duration subpulses used for spatial selectivity, making them ideal for $^1$H MRSI experiments.

In other embodiments of the invention optimal amplitude and frequency modulation functions for the STABLE adiabatic envelope may be used that minimize sampling errors.

Generic Embodiment

Figure 9:
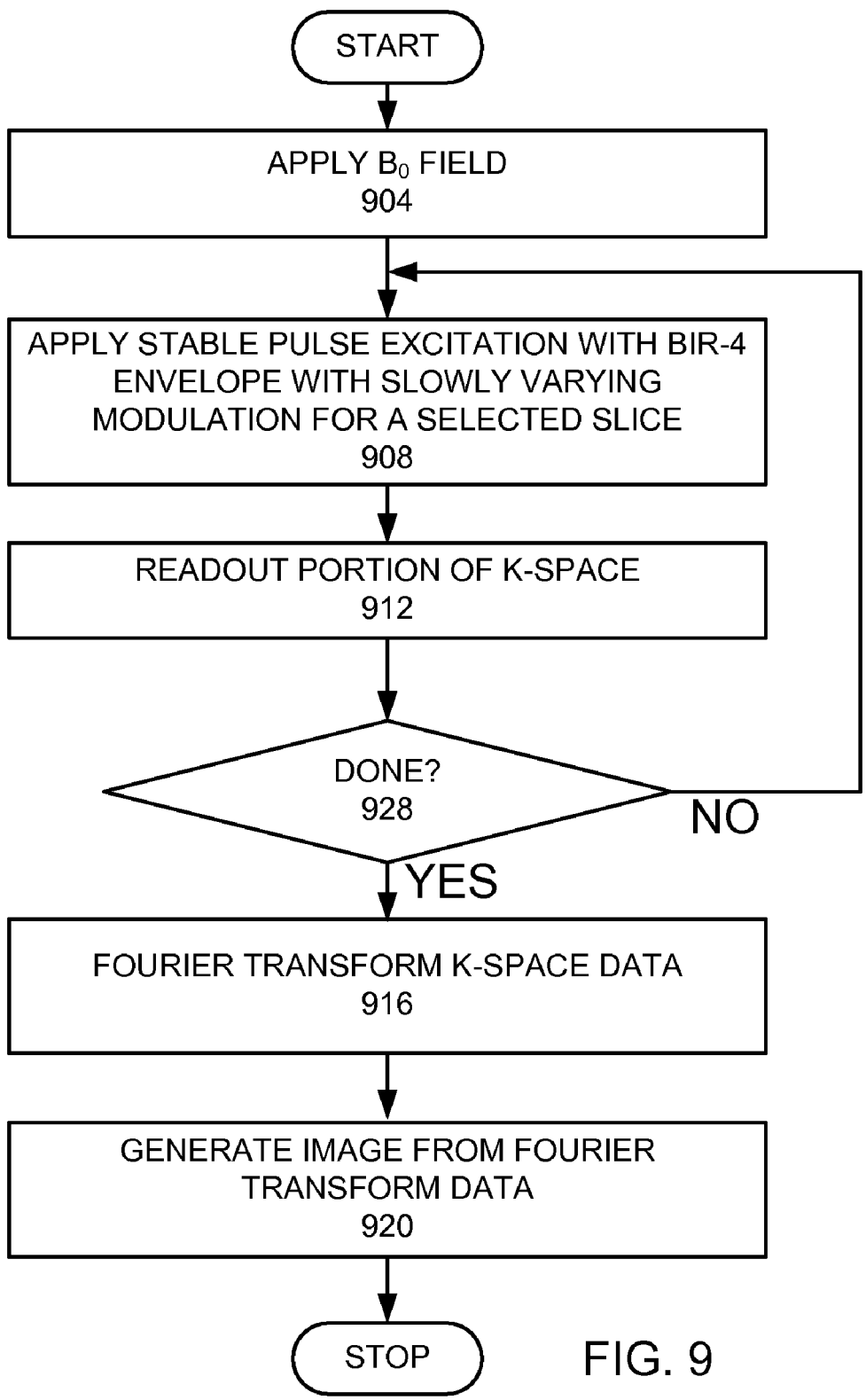
FIG. 9 is a high level flow chart of an embodiment of the invention.

FIG. 9 is a high level flow chart of a generalized embodiment of the invention. A $B_0$ field is applied (step 904). A STABLE pulse consisting of a BIR-4 envelope sampled by several subpulses, where the amplitude and frequency modulation functions of the BIR-4 envelope are slowly varying with respect to the duration of the subpulses, is used to excite a slice (step 908). A readout is performed for a portion of k-space (step 912). Steps 908 and 912 are repeated until sufficient k-space for a region of interest is acquired (step 928). In one embodiment the sufficient k-space acquisition may be the entire k-space region of interest. In another embodiment the sufficient k-space data may be less than the entire k-space, but enough to reconstruct an image. The k-space data is Fourier Transformed (step 916). An image is generated from the Fourier Transformed data (step 920). In one embodiment the readout is in 2D (two dimensional) k-space, the Fourier Transform is a 2D Fourier Transform, and the resulting image is a two dimensional image. In another embodiment, the readout, and Fourier Transform provides a three dimensional image. Other combinations of dimensions may be used in other embodiments.

Figure 10:
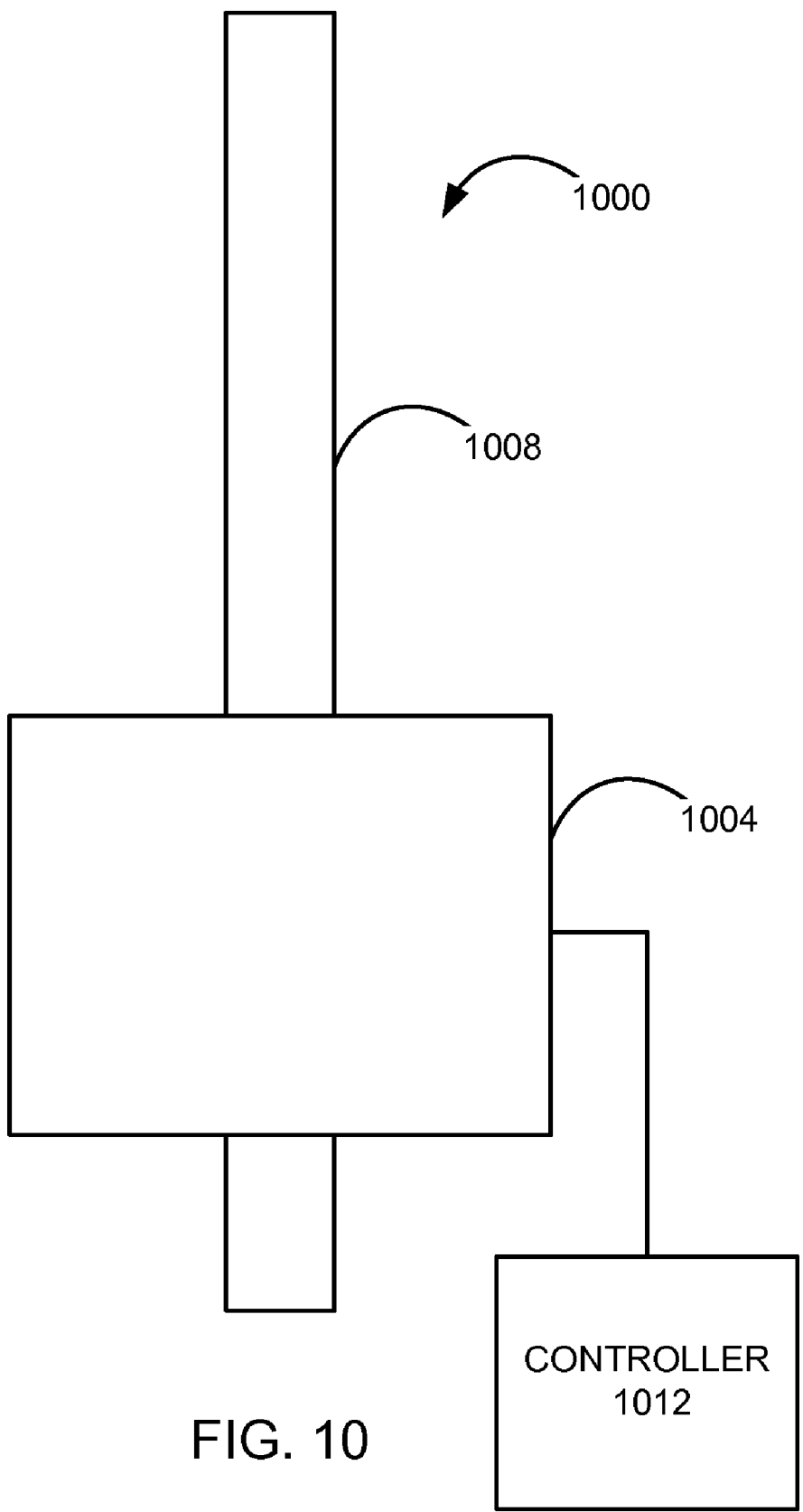
FIG. 10 is a schematic top view of a magnetic resonance imaging (MRI) system.

FIG. 10 is a schematic top view of a magnetic resonance imaging (MRI) system 1000 that may be used in an embodiment of the invention. The MRI system 1000 comprises a magnet system 1004, a patient transport table 1008 connected to the magnet system, and a controller 1012 controllably connected to the magnet system. In one example, a patient would lie on the patient transport table 1008 and the magnet system 1004 would pass around the patient. The controller 1012 would control magnetic fields and radio frequency (RF) signals provided by the magnet system 1004 and would receive signals from detectors in the magnet system 1004.

Figure 11A:
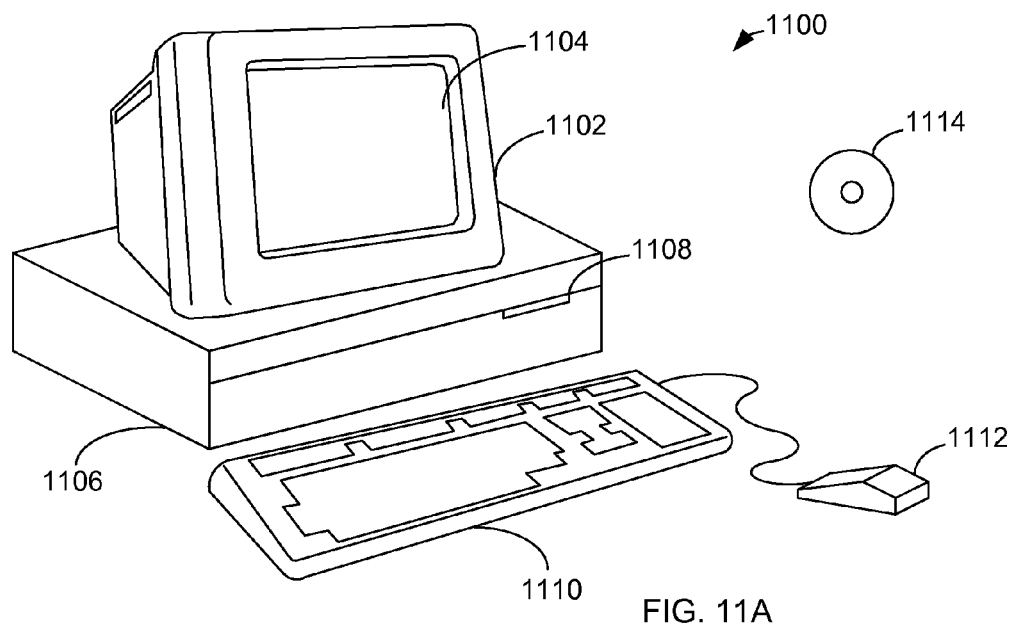
FIGS. 11A and 11B illustrate a computer system, which is suitable for implementing a controller used in embodiments of the present invention.
Figure 11B:
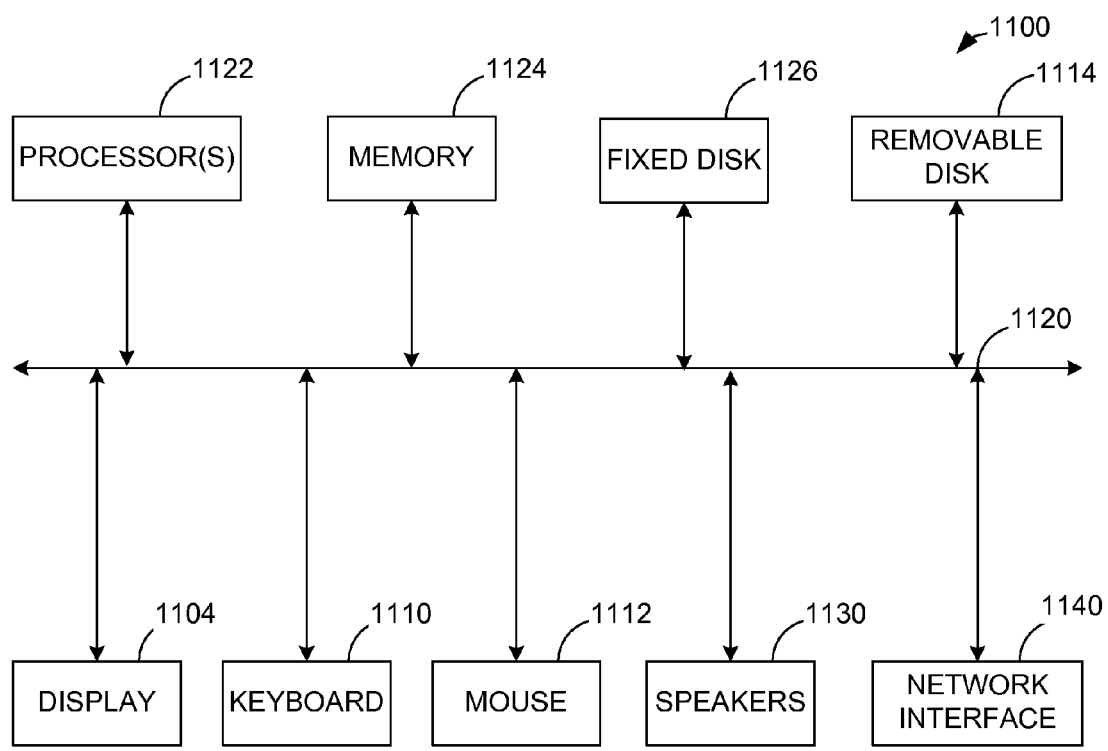

FIGS. 11A and 11B illustrate a computer system 1100, which is suitable for implementing a controller 1012 used in embodiments of the present invention. FIG. 11A shows one possible physical form of the computer system. Of course, the computer system may have many physical forms ranging from an integrated circuit, a printed circuit board, and a small handheld device up to a huge super computer. Computer system 1100 includes a monitor 1102, a display 1104, a housing 1106, a disk drive 1108, a keyboard 1110, and a mouse 1112. Disk 1114 is a computer-readable medium used to transfer data to and from computer system 1100.

FIG. 11B is an example of a block diagram for computer system 1100. Attached to system bus 1120 are a wide variety of subsystems. Processor(s) 1122 (also referred to as central processing units, or CPUs) are coupled to storage devices, including memory 1124. Memory 1124 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1126 is also coupled bi-directionally to CPU 1122; it provides additional data storage capacity and may also include any of the computer-readable media described below. Fixed disk 1126 may be used to store programs, data, and the like and is typically a secondary storage medium (such as a hard disk) that is slower than primary storage. It will be appreciated that the information retained within fixed disk 1126 may, in appropriate cases, be incorporated in standard fashion as virtual memory in memory 1124. Removable disk 1114 may take the form of the computer-readable media described below.

CPU 1122 is also coupled to a variety of input/output devices, such as display 1104, keyboard 1110, mouse 1112, and speakers 1130. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1122 optionally may be coupled to another computer or telecommunications network using network interface 1140. With such a network interface, it is contemplated that the CPU might receive information from the network, or might output information to the network in the course of performing the above-described method steps. Furthermore, method embodiments of the present invention may execute solely upon CPU 1122 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The generated image may be displayed on the display 1104.

The invention may be used to provide two dimensional (2D) images, three dimensional (3D) images, spectroscopic images, or to perform spectroscopy on a single voxel.

In other embodiments the slice selective excitation may excite multiple slices. The multiple slices may be read out for volumetric (3D) imaging.

An aspect of the invention provides slice selective excitation. Various readout methods may be used with the slice selective excitation.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for slice selective excitation for magnetic resonance imaging (MRI) implemented by a MRI system comprising a magnet system and a controller, wherein the method comprises:
   a. applying a $B_0$ field from the magnet system;
   b. applying a STABLE pulse from the magnet system comprising of a BIR-4 envelope sampled by a plurality of subpulses with a duration, where amplitude and frequency modulation functions of the BIR-4 envelope are slowly varying with respect to the duration of the subpulses;
   c. reading out a portion of k-space to obtain k-space data through the magnet system;
   d. repeating b-c until sufficient k-space data has been acquired;
   e. taking a Fourier Transform of the k-space data through the controller; and
   f. generating an image from the Fourier Transform of the k-space data through the controller.

2. The method of claim 1, wherein the STABLE pulse is a slice selective excitation pulse.

3. The method of claim 2, wherein the readout is performed for only the excited slice.

4. The method of claim 1, wherein the applied STABLE pulse is adiabatic.

5. The method of claim 4, wherein the slice selective excitation pulse is $B_1$-insensitive.

6. The method of claim 5, wherein the BIR-4 envelope is made up of four adiabatic half-passage segments, with a first and a third segment being time-reversed.

7. The method of claim 6, wherein the BIR-4 envelope has a sech/tanh amplitude and frequency modulation function.

8. The method of claim 7, wherein the frequency and amplitude modulation functions of the BIR-4 envelope have a bandwidth, wherein 1/(subpulse duration)>2*(the bandwidth of the amplitude and frequency modulation functions).

9. The method, as recited in claim 1, wherein the image is a spectroscopic image.

10. The method, as recited in claim 1, wherein the applying the STABLE pulse slice selectively excites a plurality of slices.

11. The method, as recited in claim 1, wherein the applying the STABLE pulse slice selectively excites a single slice.

12. The method of claim 1, wherein the BIR-4 envelope has a sech/tanh amplitude and frequency modulation function.

13. The method of claim 1, wherein the frequency and amplitude modulation functions of the BIR-4 envelope have a bandwidth, wherein 1/(subpulse duration)>2*(the bandwidth of the amplitude and frequency modulation functions).

14. The method of claim 1, wherein there are at least five subpulses for BIR-4 envelope.

15. A method for slice selective excitation for magnetic resonance imaging (MRI) implemented by a MRI system comprising a magnet system and a controller, wherein the method comprises:
   a. applying a $B_0$ field through the magnet system;
   b. applying a STABLE pulse comprising of a BIR-4 envelope sampled by several subpulses with a duration, where amplitude and frequency modulation functions of the BIR-4 envelope have a bandwidth where 1/(subpulse duration)>2*(the bandwidth of the amplitude and frequency modulation functions) through the magnet system;
   c. reading out a portion of k-space to obtain k-space data through the magnet system;
   d. repeating b-c until sufficient k-space has been acquired;
   e. taking a Fourier Transform of the k-space data through the controller;
   f. generating an image from the Fourier Transform of the k-space data through the controller; and
   g. displaying the image on a display.

16. The computer implemented method of claim 15, wherein there are at least five subpulses sample the BIR-4 envelope.

17. A magnetic resonance imaging apparatus, comprising:
   a magnetic resonance imaging excitation and detection system;
   a controller electrically connected to the magnetic resonance imaging excitation and detection system, comprising:
   a display;
   at least one processor; and
   computer readable media, comprising:
      computer readable code for applying a $B_0$ field;
      computer readable code for applying a STABLE pulse comprising of a BIR-4 envelope sampled by several subpulses with a duration, where amplitude and frequency modulation functions of the BIR-4 envelope have a bandwidth where 1/(subpulse duration)>2*(the bandwidth of the amplitude and frequency modulation functions);
      computer readable code for reading out a portion of k-space to obtain k-space data;
      computer readable code for repeating the applying a STABLE pulse and reading out a portion of k-space until sufficient k-space has been acquired;
      computer readable code for taking a Fourier Transform of the k-space data;
      computer readable code for generating an image from the Fourier Transform of the k-space data; and
      computer readable code for displaying the image on the display.

18. The apparatus of claim 17, wherein there are at least five subpulses sample the BIR-4 envelope.

* * * * *

UNITED STATES PATENT AND TRADEMARK OFFICE
CERTIFICATE OF CORRECTION

| | | |
|---|---|---|
| PATENT NO. | : 7,683,618 B2 | |
| APPLICATION NO. | : 12/048107 | |
| DATED | : March 23, 2010 | |
| INVENTOR(S) | : Balchandani et al. | |

It is certified that error appears in the above-identified patent and that said Letters Patent is hereby corrected as shown below:

In the Specification Under Column 1:

Replace Column 1, line no. 16-20 with:

-- FEDERALLY-SPONSORED RESEARCH OR DEVELOPMENT
This invention was made with Government support under contract RR009784 awarded by the National Institutes of Health. The Government has certain rights in this invention. --

Signed and Sealed this
Thirteenth Day of March, 2012

David J. Kappos
*Director of the United States Patent and Trademark Office*